US008179359B2

(12) United States Patent
Pai

(10) Patent No.: US 8,179,359 B2
(45) Date of Patent: May 15, 2012

(54) ANALOG BUFFER CIRCUIT CAPABLE OF COMPENSATING THRESHOLD VOLTAGE VARIATION OF TRANSISTOR

(75) Inventor: Cheng-chiu Pai, Hsin-Chu (TW)

(73) Assignee: AU Optronics Corp., Hsin-Chu (TW)

( * ) Notice: Subject to any disclaimer, the term of this patent is extended or adjusted under 35 U.S.C. 154(b) by 453 days.

(21) Appl. No.: 12/427,454

(22) Filed: Apr. 21, 2009

(65) Prior Publication Data

US 2009/0278784 A1 Nov. 12, 2009

(30) Foreign Application Priority Data

May 9, 2008 (TW) .............................. 97117260 A

(51) Int. Cl.
*G09G 3/36* (2006.01)
*G06F 3/038* (2006.01)
*H03K 3/00* (2006.01)

(52) U.S. Cl. ........... 345/100; 345/98; 345/204; 327/108

(58) Field of Classification Search ........................ None
See application file for complete search history.

(56) References Cited

U.S. PATENT DOCUMENTS 6,876,235 B2 4/2005 Li et al.
7,355,581 B2 * 4/2008 Kim ................................ 345/98
7,411,430 B2 * 8/2008 Cheng et al. .................. 327/108
7,515,132 B2 * 4/2009 Kim et al. ........................ 345/98
7,746,331 B2 * 6/2010 Tai et al. ........................ 345/204
7,834,671 B2 * 11/2010 Chen et al. .................... 327/112
2004/0183772 A1 9/2004 Nakajima et al.
2005/0162373 A1 7/2005 Yeh

FOREIGN PATENT DOCUMENTS

CN 1941053 A 4/2007
TW 200525470 8/2005

* cited by examiner

*Primary Examiner* — Andrew L Sniezek
(74) *Attorney, Agent, or Firm* — Kirton McConkie; Evan R. Witt

(57) ABSTRACT

A buffer circuit includes a driving circuit, a biasing circuit, a first switch, a second switch, a third switch, a fourth switch, a fifth switch, a sixth switch, a first capacitor, and a second capacitor. Both the first and second switches are turned on in response to a high voltage level of a first switching signal. Both the third and fourth switches are turned on in response to a high voltage level of a second switching signal. Both the fifth and sixth switches are turned on in response to a high voltage level of a third switching signal. The first capacitor stores a voltage drop of the driving circuit when the first switching signal is at high voltage level, and the second capacitor stores the voltage drop of the driving circuit when the second switching signal is at high voltage level. Output of the buffer circuit is almost identical to input due to an offset of the voltage stored in the second capacitor when the third switching signal is at high voltage level.

10 Claims, 7 Drawing Sheets

ANALOG BUFFER CIRCUIT CAPABLE OF COMPENSATING THRESHOLD VOLTAGE VARIATION OF TRANSISTOR

BACKGROUND OF THE INVENTION

1. Field of the Invention

The present invention relates to an analog buffer circuit, and more specifically, to an analog buffer circuit capable of compensating a threshold voltage variation of a transistor produced by Low Temperature Poly-Silicon (LTPS) processes.

2. Description of Prior Art

With a rapid development of display technology, novel and colorful monitors with high resolution, e.g., liquid crystal displays (LCDs), are indispensable components used in various electronic products such as monitors for notebook computers, personal digital assistants (PDAs), digital cameras, and projectors. The demand for the novel and colorful monitors has increased tremendously. A Low Temperature Poly-Silicon Liquid Crystal Display (LTPS LCD) panel, on account of high resolution demands, is widely applied to various electronic devices.

Referring to FIG. 1 showing a functional block diagram of a conventional liquid crystal display 10, the liquid crystal display 10 includes a liquid crystal panel 12, a gate driver 14, and a source driver 16. The liquid crystal panel 12 includes a plurality of pixels, each pixel having three pixel units 20 indicating three primary colors, red, green, and blue. For example, the liquid crystal display 12 with 1024 by 768 pixels contains 1024×768×3 pixel units 20. The gate driver 14 periodically outputs a scanning signal to turn on each transistor 22 of the pixel units 20 row by row, meanwhile, each pixel unit 20 is charged to a corresponding voltage based on a data signal from the source driver 16 via a corresponding data line 24, to show various gray levels. After a row of pixel units is finished to be charged, the gate driver 14 stops outputting the scanning signal to this row, and then outputs the scanning signal to turn on the transistors 22 of the pixel units of the next row. Sequentially, until all pixel units 20 of the liquid crystal panel 12 finish charging, and the gate driver 14 outputs the scanning signal to the first row again and repeats the above-mentioned mechanism.

In the conventional liquid crystal display, the gate driver 14 functions as a shift register. In other words, the gate driver 16 outputs a scanning signal to the liquid crystal display 12 at a fixed interval. For instance, a liquid crystal display 12 with 1024×768 pixels and its operating frequency with 60 Hz is provided, the display interval of each frame is about 16.67 ms(i.e., 1/60 second), such that an interval between two scanning signals applied on two row adjacent lines is about 21.7 μs (i.e., 16.67 ms/768). The pixel units 20 are charged and discharged by data voltage from the source driver 16 to show corresponding gray levels in the time period of 21.7 μs accordingly.

Referring to FIG. 2 illustrating an equivalent circuit diagram of the data line 24 and the source driver of FIG. 1, the source driver 16 comprises a digital-to-analog converter (DAC) 161 and an analog buffer 162. An equivalent circuit of each data line 24 is a combination of a data line load capacitor C and a resistor R. The DAC 161 is used for converting digital data signal voltage into analog data signal voltage to charge the load capacitor C through a bias current from the analog buffer 162, so that an alignment of liquid crystal molecules is adjusted to show various grey levels based on the analog data signal voltage. Actually, driving ability of the source driver 16 depends on output resistance of output stage and magnitude of the bias current, yet threshold voltages of transistors of the analog buffer 162 are greatly varied over a large swing voltage to degrade display quality, especially the LCD made by using LTPS processes. Therefore, it is necessary to produce an analog buffer circuit capable of compensating a threshold voltage variation of a transistor.

SUMMARY OF THE INVENTION

The present invention provides a buffer circuit comprising an input end for receiving an input signal voltage and an output end for outputting a data signal voltage. The buffer circuit comprises a driving circuit comprising a control end, a biasing circuit for biasing output of the driving circuit at a reference voltage, a first switch coupled to the control end of the driving circuit and turning on in response to a first switching signal, a second switch coupled between a first node and a second node and turning on in response to the first switching signal, a third switch coupled between the input end and the second node and turning on in response to a second switching signal, a fourth switch coupled between the first node and a third node and turning on in response to the second switching signal, a fifth switch coupled between the input end and the third node and turning on in response to a third switching signal, a sixth switch coupled between the first node end and the output end and turning on in response to the third switching signal, a first capacitor coupled between the control end of the driving circuit and the second node, and a second capacitor coupled between the control end of the driving circuit and the third node.

According to the claimed invention, a display device comprises a display panel comprising a plurality of pixel sets for showing an image, a plurality of buffer circuits, each buffer circuit corresponding to one of the pixel sets, and comprising an input end for receiving an input signal voltage and an output end for outputting a data signal voltage to the corresponding pixel set. Each buffer circuit comprises a driving circuit comprising a control end, a biasing circuit for biasing output of the driving circuit at a reference voltage, a first switch coupled to the control end of the driving circuit and turning on in response to a first switching signal, a second switch coupled between a first node and a second node and turning on in response to the first switching signal, a third switch coupled between the input end and the second node and turning on in response to a second switching signal, a fourth switch coupled between the first node and a third node and turning on in response to the second switching signal, a fifth switch coupled between the input end and the third node and turning on in response to a third switching signal, a sixth switch coupled between the first node end and the output end and turning on in response to the third switching signal, a first capacitor coupled between the control end of the driving circuit and the second node, and a second capacitor coupled between the control end of the driving circuit and the third node.

The present invention will be described with reference to the accompanying drawings, which show exemplary embodiments of the present invention.

DETAILED DESCRIPTION OF THE PREFERRED EMBODIMENTS

Figure 1:
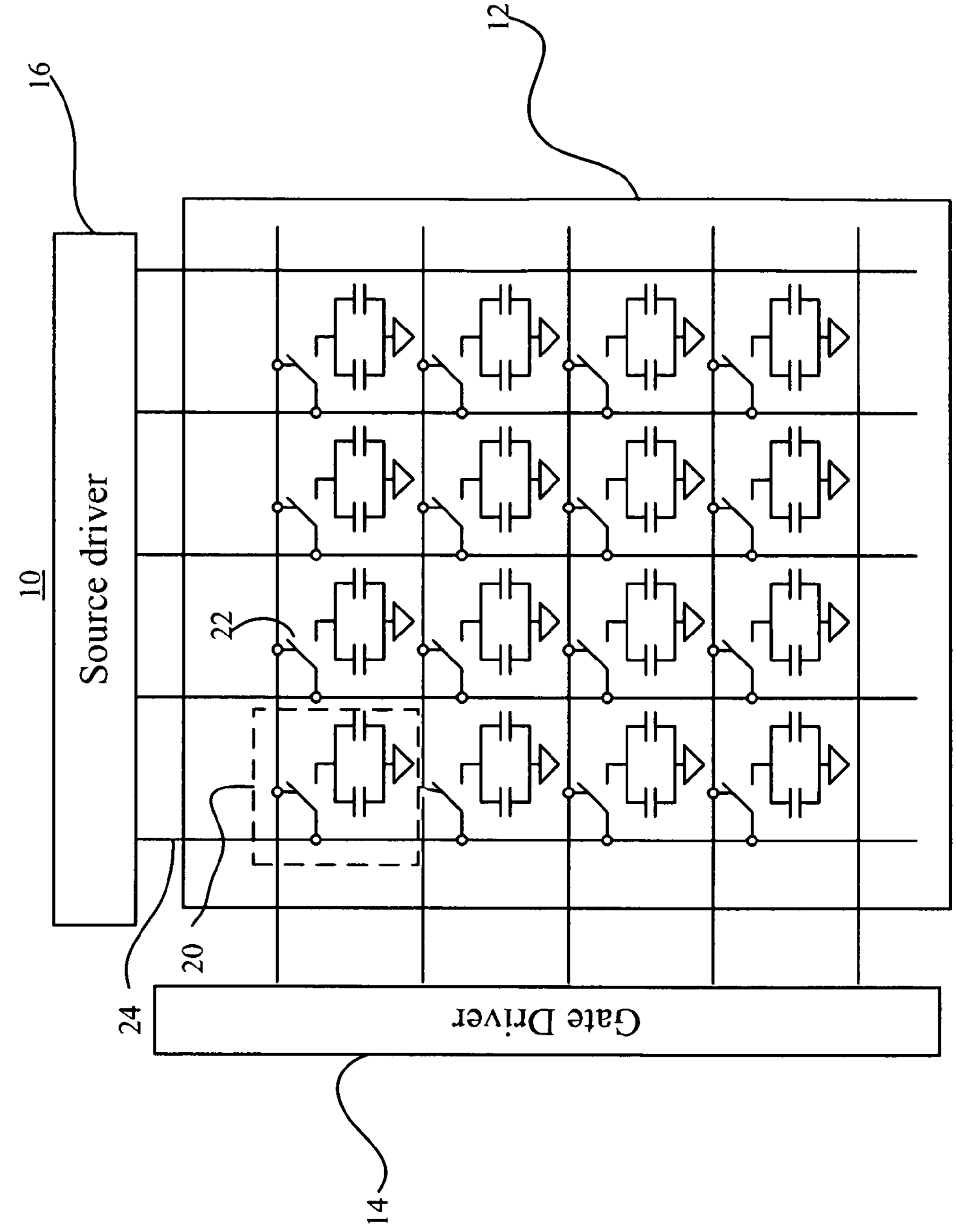
FIG. 1 (Prior Art)
FIG. 1 shows a functional block diagram of a conventional liquid crystal display.
Figure 2:
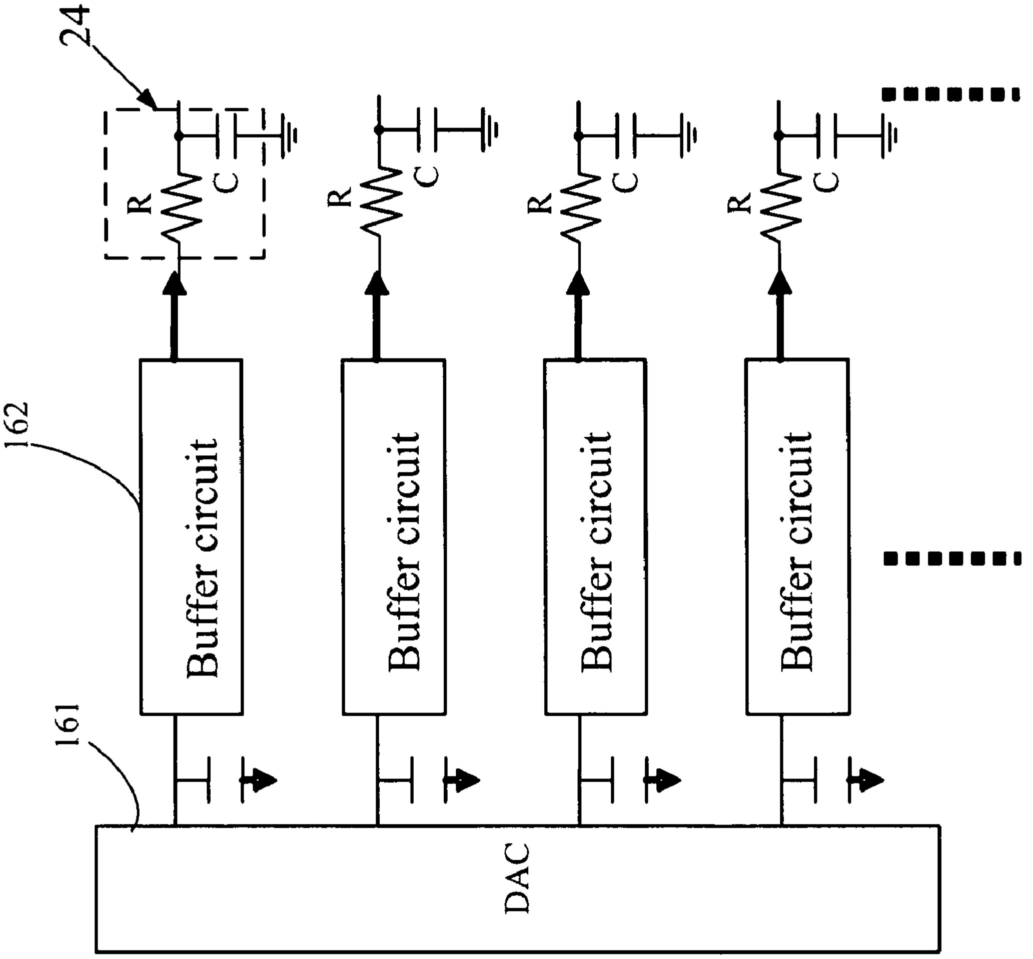
FIG. 2 (Prior Art)
FIG. 2 illustrates an equivalent circuit diagram of the data lines and the source driver of FIG. 1.
Figure 3:
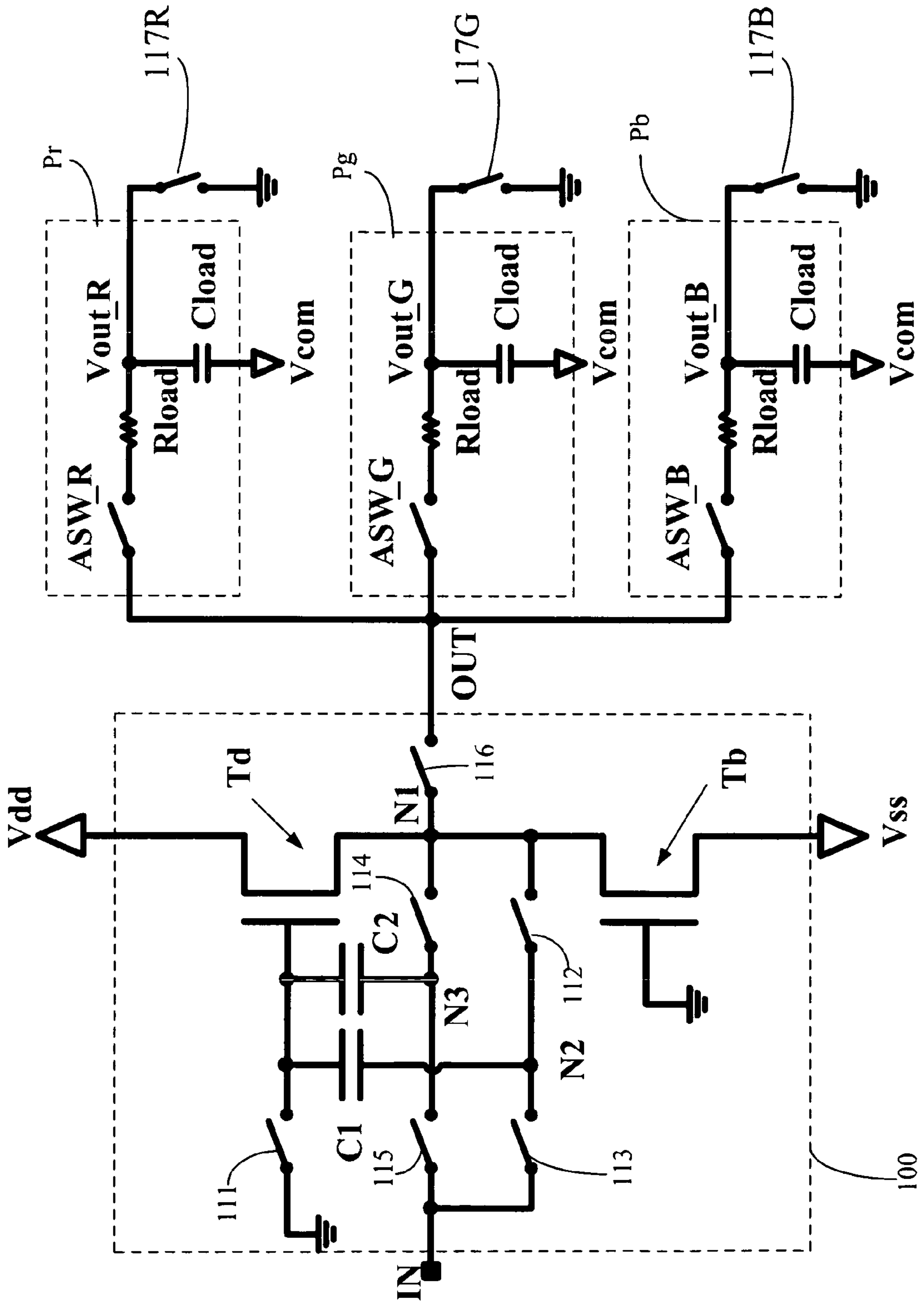
FIG. 3 shows an equivalent circuit diagram of a buffer circuit according to a first embodiment of the present invention.

Referring to FIG. 3 showing an equivalent circuit diagram of a buffer circuit 100 according to a first embodiment of the present invention, the buffer circuit 100 may be applied as an output circuit of a source driver in a liquid crystal display. The source driver receives digital data signal and converts it into analog data signal voltage to charge each pixel unit through the buffer circuit 100 and data lines. The source driver comprises a plurality of buffer circuits 100, wherein each buffer circuit 100 may be coupled to at least one pixel unit. In this embodiment, the buffer 100 is coupled to three data line units Pr, Pg, Pb. In addition to a resistance load Rload, and an load capacitor of a data line Cload, data line units Pr, Pg, Pb also comprise switching units ASW_R, ASW_G, ASW_B, respectively. Take data line unit Pr as an example, the load capacitor Cload is charged by analog data signal voltage Vout_R from the buffer circuit 100 to adjust an alignment of liquid crystal molecules to show various grey levels, as the switching unit ASW_R turns on in response to a first enabling signal ASW[R]. The buffer circuit 100 comprises an input end IN for receiving input signal voltage, and an output end OUT for outputting data signal voltage. The buffer circuit 100 comprises a driving circuit Td, a biasing circuit Tb, a first switch 111, a second switch 112, a third switch 113, a fourth switch 114, a fifth switch 115, a sixth switch 116, a first capacitor C1, and a second capacitor C2. The biasing circuit Tb may be a source follower. Each data line unit Pr, Pg, Pb is coupled to a corresponding fourth switching unit 117R, 117G, 117B, which is turned on in response to an enabling signal SW.

Figure 4:
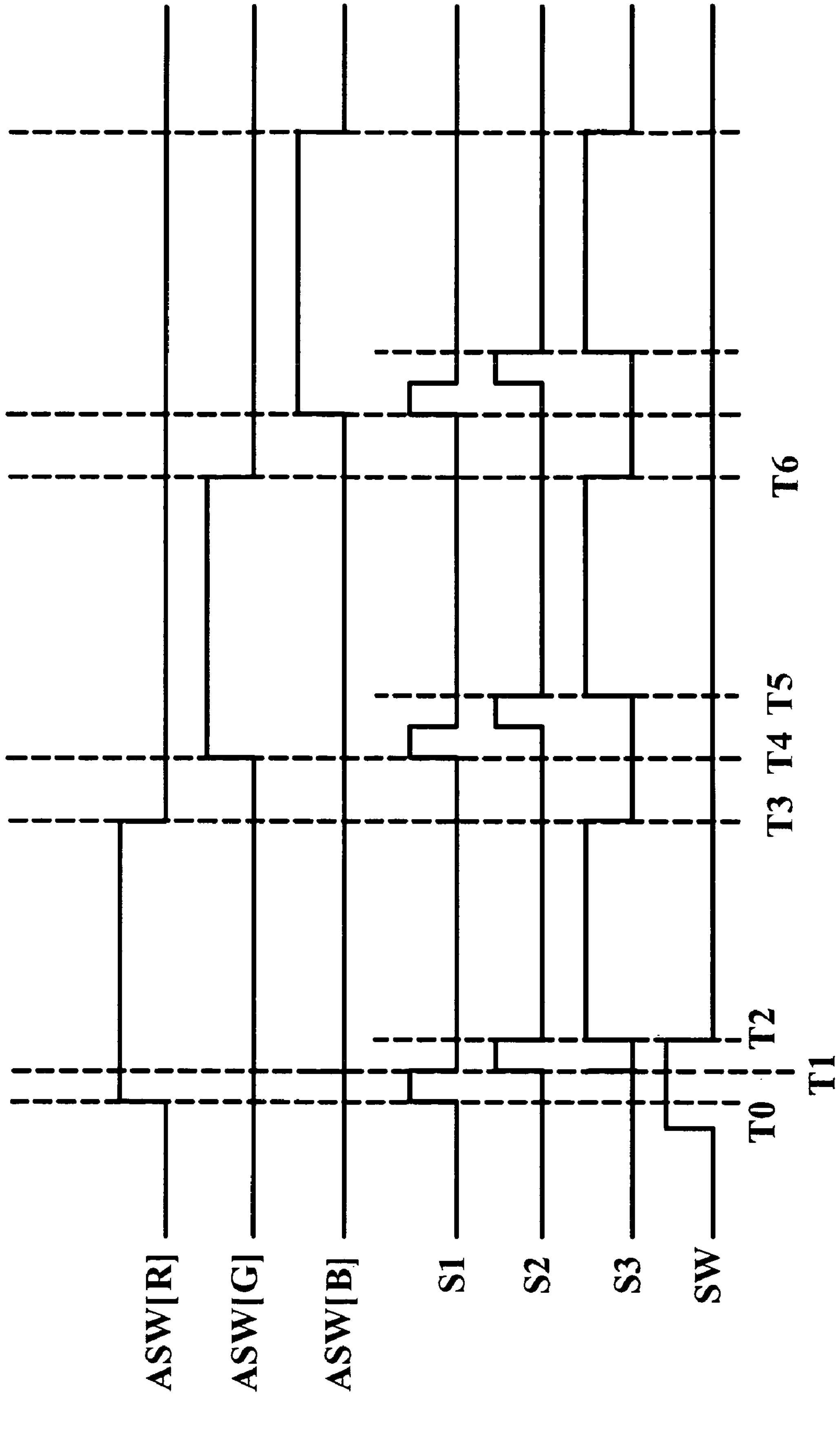
FIG. 4 shows a timing diagram of switching signals and enabling signals applied on switches and switching units shown in FIG. 3.

With reference to FIG. 3 and FIG. 4, FIG. 4 shows a timing diagram of switching signals and enabling signals applied on switches and switching units shown in FIG. 3. The driving circuit Td or the biasing circuit Tb may be implemented by a transistor. The driving circuit Td comprises a drain coupled to a first supply voltage Vdd, and a control end, i.e. a gate, coupled to a reference voltage (e.g. Ground end GND). The biasing circuit Tb comprises a control end, i.e. a gate, coupled to the reference voltage, and a source coupled to a second supply voltage Vss. The first switch 111 is coupled between the control end of the driving circuit Td and the reference end GND, the second switch 112 is coupled between a first node N1 and a second node N2. The switches 111, 112 turn on in response to a first switching signal S1. The third switch 113 is coupled between the input end IN and the second node N2. The fourth switch 114 is coupled between the first node N1 and the third node N3. The switches 113, 114 turn on in response to a second switching signal S2. The fifth switch 115 is coupled between the input end IN and the third node N3. The sixth switch 116 is coupled between the first node N1 and the output end OUT. The switches 115, 116 turn on in response to a third switching signal S3. The first capacitor C1 is coupled between the control end of the driving circuit Td and the second node N2. The second capacitor C2 is coupled between the control end of the driving circuit Td and the third node N3.

Because the buffer circuits 100 charges the data lines and pixel units in sequence, and data line and pixel units operate in the same way, for brevity, only the data line unit Pr and the corresponding buffer circuit 100 are taken as an example, operations of other data line units are omitted. Referring to FIG. 4, during time period T0-T3, the switching unit ASW_R turns on in response to the enabling signal ASW[R], and the output of buffer circuit 100 is transmitted to data line unit Pr, accordingly. Meanwhile, the switching unit ASW_G and switching unit ASW_B turns off, and thus the output of the buffer circuit 100 fails to charge the data line units Pg and Pb.

During T0-T2, the third switching signal S3 is at a low voltage level, so that the switches units 115, 116 are turned off, and the output of the buffer circuit 100 fails to transmit to the data line unit Pr. However, during T0-T1, the switching signal S1 is at the high voltage level, whereas the switching signal S2 is at the low voltage level. Therefore, the switches 111 and 112 are turned off, while the switches 113 and 114 are turned on. This results in analog data voltage Vin applying on the first capacitor C1, as well as an increase of the voltage on node N1 up to Vin+|Vgs| due to the capacitor coupling effect. Meanwhile, voltage on the node N3 is equal to Vin(Vin+|Vgs|−|Vgs|) because of a gate-source voltage drop |Vgs| of the driving circuit Td. The gate-source voltage drop |Vgs| of the driving circuit Td can also be stored in the second capacitor C2.

During time period T0-T2, the fourth switching unit 117R is turned on in response to the enabling signal SW to discharge residual data signal voltage previously stored in the load capacitor Cload.

Afterwards, during time period T2-T3, the third switching signal S3 is at a high voltage level, so that the switches 115, 116 are turned on, and the output of the buffer circuit 100 transmits to the data line unit Pr. Meanwhile, the switching signals S1 and S2 are at low voltage level, and thus the switches 111-114 are turned off. This results in analog data voltage Vin is applied on the second capacitor C2, as well as an increase of the voltage on node N1 up to Vin+|Vgs| due to the capacitor coupling effect. Meanwhile, voltage on the node N3 is equal to Vin(Vin+|Vgs|−|Vgs|) because of a gate-source voltage drop |Vgs| of the driving circuit Td. Because the switch 116 and the switching unit ASW_R are turned on, the load capacitor Cload is charged by voltage Vout, similar to voltage Vin on the third node N3, on the output end OUT. Therefore, voltage Vout on the output end OUT is identical to voltage Vin on the input end IN, independent of threshold voltage Vth of the driving circuit Td.

During time period T4-T6, the switching unit ASW_G is turned on in response to the enabling signal ASW[G], and the output of buffer circuit 100 is transmitted to data line unit Pb, accordingly. Meanwhile, the switching unit ASW_R and switching unit ASW_B are turned off, thus the output of the buffer circuit 100 fails to charge the data line units Pr, Pb. Since the buffer circuits 100 operates in the same way as previously mentioned, and further explanation is omitted.

Figure 5:
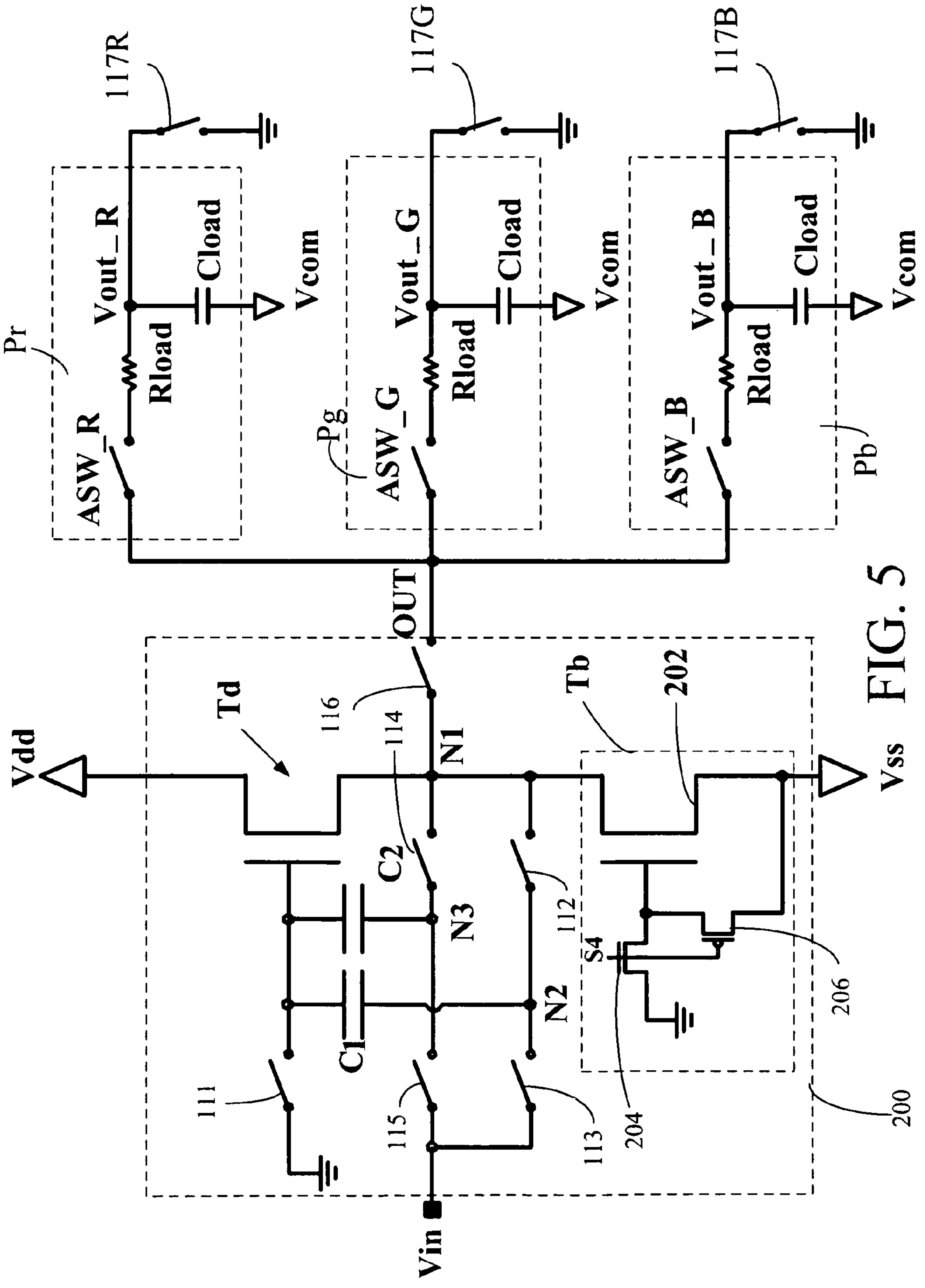
FIG. 5 shows an equivalent circuit diagram of a buffer circuit according to a second embodiment of the present invention.
Figure 6:
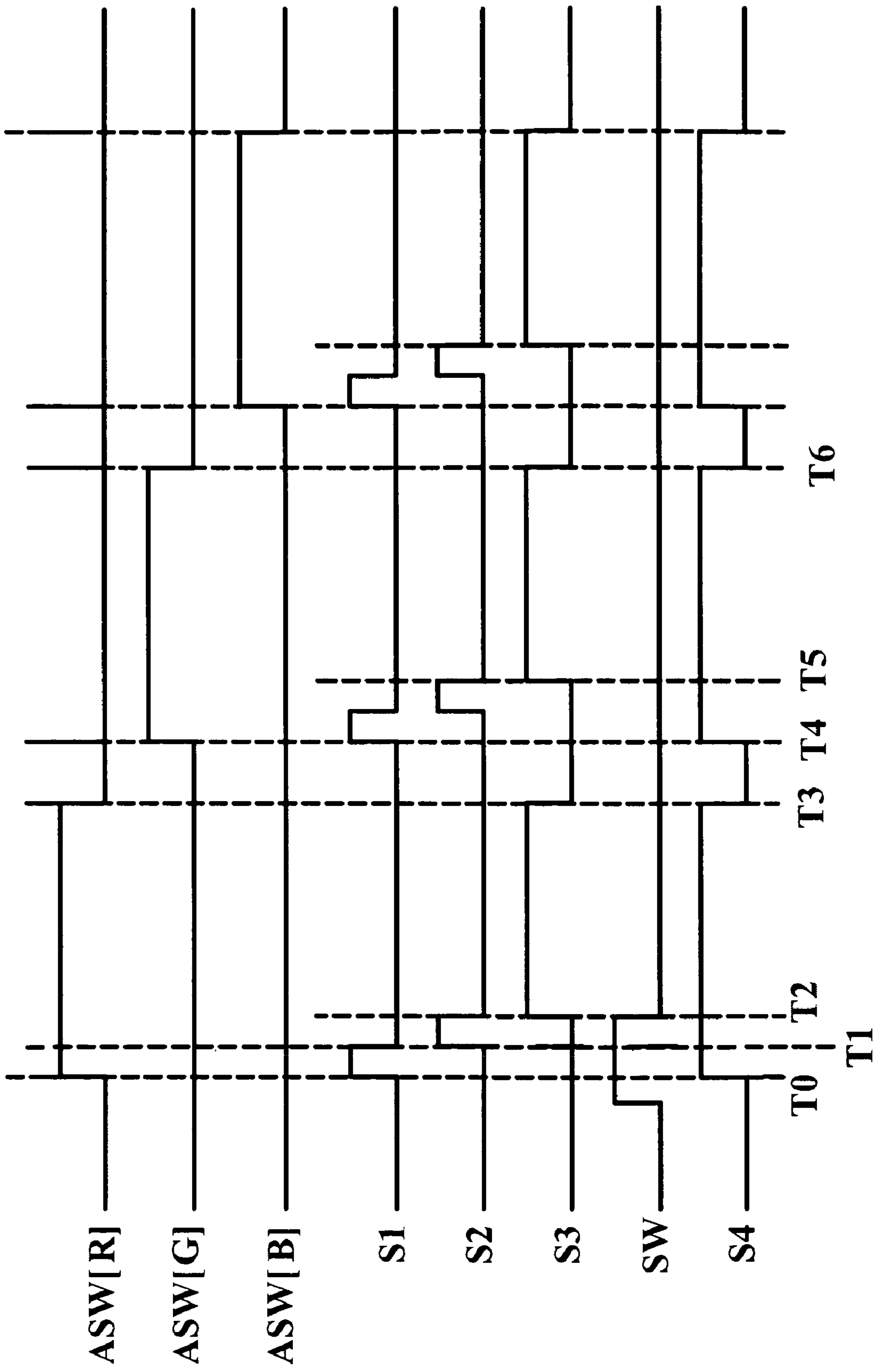
FIG. 6 shows a timing diagram of switching signals and enabling signals applied on switches and switching units shown in FIG. 5.

Referring to FIG. 5 showing an equivalent circuit diagram of a buffer circuit 200 according to a second embodiment of the present invention, and FIG. 6 showing a timing diagram of switching signals and enabling signals applied on switches and switching units shown in FIG. 5, for simplicity, elements of buffer circuit 200 in FIG. 5 that have the same function as that illustrated in FIG. 3 are provided with the same numerals as those used in FIG. 3. A biasing circuit Tb of the buffer circuit 200 comprises an NMOS element 202, a seventh switch 204, and a PMOS element 206. The NMOS element 202 comprises a gate and a drain coupled to a first node N1. The seventh switch 204 which is coupled to the reference voltage (ground end GND) and the gate of the NMOS element 202 is turned on in response to a fourth switching signal S4. The PMOS element 206 comprises a gate coupled to the fourth switching signal, and a drain coupled to the gate of the NMOS element 202. The fourth switching signal S4 is at high voltage level during the time period T0-T3 which analog data signal voltage is fed to the corresponding data line and the corresponding pixel unit. Meanwhile, the biasing circuit Tb provides a bias voltage to bias the output of the driving circuit Td at the reference voltage. In other words, the biasing circuit Tb of the buffer circuit 200 periodically outputs the reference voltage instead of supplies a steady DC reference voltage. Compared to the buffer circuit 100, the buffer circuit 200 reduces DC power consumption.

Figure 7:
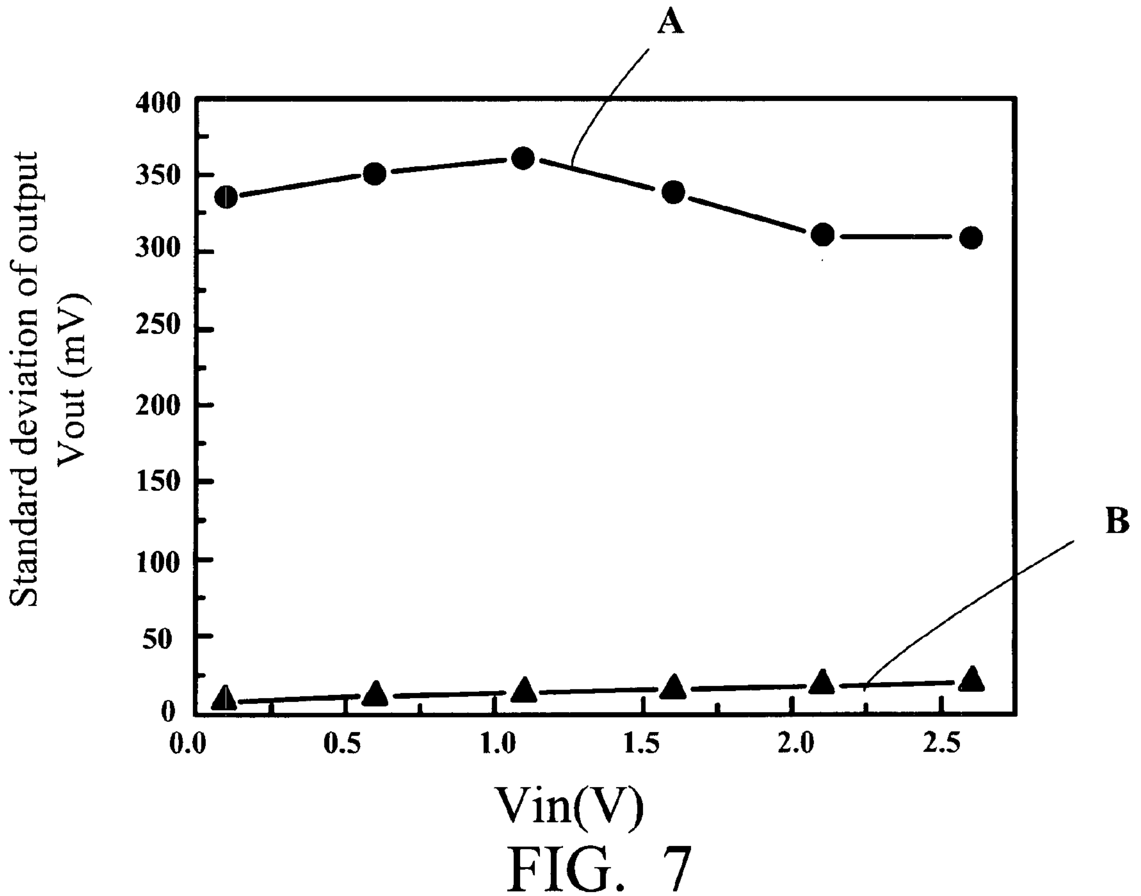
FIG. 7 depicts a relationship between an input and a standard deviation of an output of the buffer circuit according to prior art and the present invention

Referring to FIG. 7 depicting a relationship between an input and a standard deviation of an output of the buffer circuit according to prior art and the present invention, where curve A indicates a relationship between an input and a standard deviation of an output of the conventional buffer circuit, curve B indicates a relationship between an input and a standard deviation of an output of the present inventive buffer circuit, the input of the present inventive buffer circuit is close to the standard deviation of the output. This means the input voltage Vin almost equals to output voltage Vout. Conversely, a larger output variation of the conventional buffer circuit resulting from threshold voltage variations of transistors makes instable output quality.

In conclusion, the present inventive buffer circuit outputs stable analog data signal voltage, regardless of a threshold voltage of a transistor therein. The source driver using the present inventive buffer circuit can supply accurate output voltage, enhance driving ability to the data line, and shorten charge time period. Also, the present inventive buffer circuit is simplified and hence reduces a layout area.

Although the present invention has been explained by the embodiments shown in the drawings described above, it should be understood to the ordinary skilled person in the art that the invention is not limited to the embodiments, but rather various changes or modifications thereof are possible without departing from the spirit of the invention. Accordingly, the scope of the invention shall be determined only by the appended claims and their equivalents.

What is claimed is:

1. A buffer circuit comprising an input end for receiving an input signal voltage and an output end for outputting a data signal voltage, the buffer circuit comprising:

a driving circuit comprising a control end;

a biasing circuit for biasing output of the driving circuit at a reference voltage;

a first switch coupled to the control end of the driving circuit and turning on in response to a first switching signal;

a second switch coupled between a first node and a second node and turning on in response to the first switching signal;

a third switch coupled between the input end and the second node and turning on in response to a second switching signal;

a fourth switch coupled between the first node and a third node and turning on in response to the second switching signal;

a fifth switch coupled between the input end and the third node and turning on in response to a third switching signal;

a sixth switch coupled between the first node end and the output end and turning on in response to the third switching signal;

a first capacitor coupled between the control end of the driving circuit and the second node; and a second capacitor coupled between the control end of the driving circuit and the third node, wherein the biasing circuit comprises an NMOS element comprising a drain coupled to the first node and a gate, a seventh switch coupled between the reference voltage and the gate of the NMOS element and turning on in response to a fourth switching signal, and a PMOS element comprising a gate coupled to the fourth switching signal and a drain coupled to the gate of the NMOS element.

2. The buffer circuit of claim 1, wherein the biasing circuit is a source follower realized by a transistor.

3. The buffer circuit of claim 1 being applied in an LTPS liquid crystal display.

4. A display device comprising:

a display panel comprising a plurality of data lines and a plurality of pixel sets for showing an image based on data voltage via the data lines;

a plurality of buffer circuits, each buffer circuit corresponding to one of the pixel sets, and comprising an input end for receiving an input signal voltage and an output end for outputting a data signal voltage to the corresponding pixel set, each buffer circuit comprising:

a driving circuit comprising a control end;

a biasing circuit for biasing output of the driving circuit at a reference voltage;

a first switch coupled to the control end of the driving circuit and turning on in response to a first switching signal;

a second switch coupled between a first node and a second node and turning on in response to the first switching signal;

a third switch coupled between the input end and the second node and turning on in response to a second switching signal;

a fourth switch coupled between the first node and a third node and turning on in response to the second switching signal;

a fifth switch coupled between the input end and the third node and turning on in response to a third switching signal;

a sixth switch coupled between the first node end and the output end and turning on in response to the third switching signal;

a first capacitor coupled between the control end of the driving circuit and the second node; and a second capacitor coupled between the control end of the driving circuit and the third node, wherein the biasing circuit comprises an NMOS element comprising a drain coupled to the first node and a gate, a seventh switch coupled between the reference voltage and the gate of the NMOS element and turning on in response to a fourth switching signal, and a PMOS element comprising a gate coupled to the fourth switching signal and a drain coupled to the gate of the NMOS element.

5. The display device of claim 4, wherein the biasing circuit is a source follower realized by a transistor.

6. The display device of claim 4, wherein each pixel set comprises a first pixel, a second pixel, and a third pixel, the first, second and third pixels are coupled to the output end of the corresponding buffer circuit.

7. The display device of claim 6, further comprising:

a first switching unit coupled between the first pixel and the output end of the buffer circuit, for switching the data signal voltage to the first pixel in response to a first enabling signal;

a second switching unit coupled between the second pixel and the output end of the buffer circuit, for switching the data signal voltage to the second pixel in response to a second enabling signal; and a third switching unit coupled between the third pixel and the output end of the buffer circuit, for switching the data signal voltage to the third pixel in response to a third enabling signal.

8. The display device of claim 7 further comprising a plurality of fourth switching units, each fourth switching unit in response to an enabling signal to pre-charge one of the plurality of data lines.

9. The display device of claim 7, wherein the first, second, and third enabling signals are triggered at different moment.

10. The display device of claim 4, wherein the display panel is a Low Temperature Poly-Silicon (LTPS) liquid crystal panel.

* * * * *